US007687826B2

(12) United States Patent
Schulze et al.

(10) Patent No.: US 7,687,826 B2
(45) Date of Patent: Mar. 30, 2010

(54) THYRISTOR WITH RECOVERY PROTECTION

(75) Inventors: Hans-Joachim Schulze, Ottobrunn (DE); Franz Josef Niedernostheide, Muenster (DE); Uwe Kellner-Werdehausen, Leutenbach (DE); Reiner Barthelmess, Soest (DE)

(73) Assignee: Infineon Technologies AG

( * ) Notice: Subject to any disclaimer, the term of this patent is extended or adjusted under 35 U.S.C. 154(b) by 481 days.

(21) Appl. No.: 11/463,188

(22) Filed: Aug. 8, 2006

(65) Prior Publication Data

US 2007/0051972 A1    Mar. 8, 2007

(30) Foreign Application Priority Data

Aug. 9, 2005    (DE) .................. 10 2005 037 573

(51) Int. Cl.
*H01L 29/74* (2006.01)
*H01L 31/111* (2006.01)

(52) U.S. Cl. ............... 257/157; 257/115; 257/E27.052; 257/E29.036; 438/133

(58) Field of Classification Search .................. 257/107, 257/115, 157, E27.052, E31.071, E27.079, 257/E29.036, E29.038, E29.046, E29.115; 438/133
See application file for complete search history.

(56) References Cited

U.S. PATENT DOCUMENTS 5,223,442 A    6/1993  Kitagawa et al. ............... 437/6

5,861,639 A    1/1999  Bernier ......................... 257/157
6,977,425 B2 *  12/2005  Yoshida et al. ............... 257/517

FOREIGN PATENT DOCUMENTS

| DE | 1935164 | 7/1970 |
| DE | 3308689 A1 | 9/1984 |
| DE | 3733100 C3 | 4/1988 |
| DE | 19947028 A1 | 4/2001 |
| DE | 102004042163 A1 | 3/2006 |
| DE | 102004047626 A1 | 4/2006 |
| EP | 0430237 A1 | 6/1991 |
| JP | 59225566 | 12/1984 |

OTHER PUBLICATIONS

Schulze et al., Thyristor with Integrated Forward Recovery Protection Function, International Symposium on Power Semiconductor Devices & ICs, Osaka, pp. 199-202, 2001.

* cited by examiner

*Primary Examiner*—Davienne Monbleau
*Assistant Examiner*—Dilinh P Nguyen
(74) *Attorney, Agent, or Firm*—Coats & Bennett, P.L.L.C.

(57) ABSTRACT

A main thyristor (1) has a recovery protection which is integrated into a drive thyristor (2) whose n-doped emitter (25) is electrically connected to a main thyristor control terminal (140). Moreover, the p-doped emitter (28) of the drive thyristor (2) is electrically connected to the p-doped emitter (18) of the main thyristor (1). Various optional measures for realizing a recovery protection are provided in this case. A method for producing a thyristor system having a main thyristor and a drive thyristor, the drive thyristor (2) having anode short circuits (211) involves introducing particles (230) into a target region (225) of the semiconductor body (200) of the drive thyristor (2), the distance between the target region (225) and a front side (201) of the semiconductor body (200) opposite to the rear side (202) being less than or equal to the distance between the p-doped emitter (28) and the front side (201).

22 Claims, 7 Drawing Sheets

THYRISTOR WITH RECOVERY PROTECTION

PRIORITY

This application claims priority from German Patent Application No. DE 10 2005 037 573.1, which was filed on Aug. 9, 2005, and is incorporated herein by reference in its entirety.

TECHNICAL FIELD

The invention relates to a thyristor with recovery protection.

BACKGROUND

When a thyristor is turned off, its semiconductor body still contains a relatively high number of free charge carriers which are not dissipated until within a so-called recovery time to the extent where the thyristor finally effects blocking reliably.

However, if the thyristor is subjected to a pulsed voltage loading within the recovery time, then an uncontrolled triggering of the thyristor may occur on account of a still excessively high number of free charge carriers in the semiconductor body. In this case, current filaments may form which have such a high current density that the thyristor may be destroyed.

Therefore, it is generally attempted to construct thyristors in such a way that they are insensitive to voltage surges which occur in the forward direction within the recovery time.

DE 199 47 028 A1 discloses an asymmetrically blocking thyristor with a driver stage. The driver stage comprises an n-doped auxiliary emitter, which makes contact with a metallization of the driver stage. Three variants are provided for improving the recovery protection in this case.

In a first variant, the transistor gain factor of a transistor formed from the n-doped auxiliary emitter, the p-doped base and the n-doped base below the metallization of the driver stage is greater than the transistor gain factor of a transistor formed from the n-doped emitter, the p-doped base and the n-doped base below the cathode of the thyristor.

In a second variant, the transistor gain factor of a transistor formed from the p-doped base, the n-doped base and the p-doped emitter below the metallization of the at least one driver stage is greater than the transistor gain factor of a transistor formed from the p-doped base, the n-doped base and the p-doped emitter below the cathode of the thyristor.

A third variant provides anode short circuits which connect the n-doped base and the anode electrode of the thyristor to one another and the electrical conductivity of which is smaller below the metallization of at least one driver stage than below the cathode electrode.

H. J. Schulze et al.: "Thyristor with Integrated Forward Recovery Protection" Proc. ISPSD 2001 firstly discloses, in the case of a symmetrically blocking thyristor with a triggering stage structure, setting the charge carrier lifetime such that it is significantly higher in the region of the triggering stage structure than in the region of the main cathode.

Secondly, the disclosure of said document shows n-doped islands incorporated into the p-doped emitter. Said n-doped islands act as local transistors which make additional free charge carriers available during the blocking phase of the thyristor.

SUMMARY

A thyristor system may comprise a main thyristor and a drive thyristor. The thyristor system can be triggered by a procedure in which firstly the drive thyristor is triggered, for example by means of light, and said drive thyristor supplies the triggering current for the main thyristor.

The main thyristor may comprise a semiconductor body, in which a p-doped emitter, an n-doped base, a p-doped base and an n-doped emitter are arranged successively proceeding from a rear side. Furthermore, the main thyristor may comprise a triggering stage region having at least one triggering stage, and also a main cathode region adjacent to the triggering stage region in the lateral direction.

The drive thyristor may have a semiconductor body, in which a p-doped emitter, an n-doped base, a p-doped base and an n-doped emitter are arranged successively proceeding from a rear side. The drive thyristor may comprise a triggering stage region having at least one triggering stage and a main cathode region adjacent to the triggering stage region in the lateral direction.

For interconnecting the main thyristor and the drive thyristor, the n-doped emitter of the drive thyristor can be electrically connected to a control terminal of the main thyristor. Moreover, the p-doped emitters of the main thyristor and of the drive thyristor can be electrically connected to one another.

In order to protect the main thyristor from damage on account of a triggering pulse occurring during its recovery time and thus to realize a recovery protection, provision can be made for providing the drive thyristor with a recovery protection. In addition, or as an alternative, the drive thyristor may also have a breakdown structure.

BRIEF DESCRIPTION OF THE DRAWINGS

The invention is explained in more detail below with reference to figures in which.

In the figures, identical reference symbols designate identical parts with an identical meaning.

DETAILED DESCRIPTION

In order to realize a recovery protection for the drive thyristor, various measures can be provided in accordance with preferred embodiments, which measures may also be combined with one another in a suitable manner.

In accordance with a first measure, provision is made for choosing the charge carrier lifetime of the n-doped base of the drive thyristor, which is preferably at least 300 µs in the triggering stage region and/or in the main cathode region, to be greater than the charge carrier lifetime of the n-doped base of the main thyristor. This measure has the effect that—with an otherwise identical design of the main cathode of the drive thyristor and of the main thyristor and identical operating conditions—the main cathode of the drive thyristor remains turned on for significantly longer than that of the main thyristor. If the design of the main cathode and the operating temperatures of the two thyristors—given an identical charge carrier lifetime in the respective n-type base zones of the thyristors—are chosen such that the main cathode of the main thyristor remains turned on for longer than that of the drive thyristor, then it is possible here, too, to achieve a reversal of the conditions by means of a correspondingly large difference between the charge carrier lifetimes in the two thyristors.

In accordance with a second measure, provision can be made for choosing the charge carrier lifetime of the n-doped base of the drive thyristor, e.g. in the region of the triggering structure thereof, to be greater than the charge carrier lifetime of the n-doped base of the drive thyristor in the main cathode region, preferably at least twice as great, and in a further preferred embodiment for silicon-type based systems, greater than 800 µs.

In accordance with a third measure, the drive thyristor may have n-doped islands incorporated into the p-doped emitter of the drive thyristor in the triggering stage region. Said n-doped islands of the drive thyristor are preferably more heavily doped than corresponding n-doped islands implemented as required in the triggering stage region of the main thyristor.

A fourth measure can provide for the p-doped emitter in the triggering stage region of the drive thyristor to have a dopant concentration greater than the dopant concentration of the p-doped emitter of the main thyristor in the main cathode region thereof.

In accordance with a fifth measure, the p-doped emitter in the triggering stage region of the drive thyristor may have a dopant concentration greater than the dopant concentration of the p-doped emitter of the drive thyristor in the main cathode region thereof.

The fourth and fifth measures and also all measures explained below can be suitable in particular for the case of asymmetrically blocking thyristors having anode short circuits. In principle, however, the fourth and fifth measures can be also suitable for symmetrically blocking thyristors.

In accordance with a sixth measure, the drive thyristor may have anode short circuits, the cross sectional area ratio of which is smaller in the triggering stage region than in the main cathode region.

The cross sectional area ratio of a predetermined region in which short-circuit regions are arranged can be defined here as the ratio between the sum of all cross sectional area portions of the short-circuit regions which are situated within said region and the area of the region.

A seventh measure may provide for the main thyristor also to have anode short circuits, the anode short circuits in the main cathode region of the drive thyristor having a cross sectional area ratio that is smaller than the cross sectional area ratio of the anode short circuits in the main cathode region of the main thyristor.

In accordance with an eighth measure, the drive thyristor may have an n-doped field stopping zone arranged directly before or at a distance from the p-type emitter. Said field stopping zone is designed either locally in the triggering stage region or in the entire drive thyristor such that the p-type emitter has better injection properties in these regions than the p-type emitter of the main thyristor. This can be achieved, e.g. by a reduction of the maximum doping and/or by reduction of the dose of the field stopping zone.

A ninth measure may provide for locally raising the dopant concentration of the p-doped base of the drive thyristor in the triggering stage region. This is because the p-type base forms, together with the $n^-$-type base and the $n^+$-type anode short circuit regions a $pn^-n^+$ diode which is forward-biased upon application of a thyristor reverse voltage and thus injects charge carriers into the AG region. This charge carrier injection in turn can advantageously be utilized for the integration of the recovery protection since a reverse voltage is usually present across the entire thyristor system during the so-called recovery phase and the $pn^-n^+$ diode is consequently forward-biased. As a result of raising the p-type doping of the base of the drive thyristor in the triggering stage region, this local $pn^-n^+$ diode of the drive diode is then advantageously designed such that a largest possible portion of the reverse current of the diode which is connected in series with the drive and main thyristors and takes up the majority of the reverse voltage present across the entire thyristor system flows through precisely said local $pn^-n^+$ diode of the drive diode.

The following are generally not suitable for raising the p-type doping concentration:

the regions of the p-type base below the emitters of the individual triggering stages, regions in the vicinity of the first triggering stage in which the doping of the p-type base is locally reduced for the integration of a so-called dU/dt protection function, regions of the p-type base in which a resistor is integrated, regions within the triggering stage in which an overvoltage protection function in the form of a breakdown structure is integrated.

All other regions of the p-type base zone in the triggering stage region of the drive thyristor are suitable, in principle, for locally increasing the p-type doping concentration.

A tenth measure, which is likewise suitable for increasing the current through the parasitic $pn^-n^+$ diode just described in the triggering stage region of the drive thyristor during the recovery phase under blocking loading of the thyristor, may form a local increase in the depth of the corresponding $n^+$-type emitter short circuit regions. This can be achieved, e.g. by means of an additional, optionally masked implantation of protons and a subsequent annealing process (typically: T between 220° C. and 500° C., t between 30 min and 10 h), the acceleration energy of the protons being chosen so as to result in a penetration depth that exceeds the depth of the $n^+$-type anode short circuits. A further possibility consists in carrying out an additional, optionally masked diffusion process using a rapidly diffusing donor, such as e.g. sulfur or selenium. The simplest possibility for realization consists in the anode short circuits present in the drive thyristor, which are usually produced by a phosphorus doping, being indiffused more deeply than those in the main thyristor.

In accordance with an eleventh measure, the drive thyristor may have n-doped anode short circuits which are arranged in the heavily p-doped emitter and which connect the anode electrode of the drive thyristor to the n-doped base thereof. In a cross section—running perpendicular to the vertical direction—through the semiconductor body of the drive thyristor, the anode short circuits have a cross sectional area ratio which is preferably smaller in the triggering stage region than in the main cathode region.

The anode short circuits can be preferably produced by means of a masked diffusion process in which n-doping dopants, for example, phosphorus, are indiffused into the semiconductor body of the main thyristor and drive thyristor, respectively, proceeding from the rear side. In this case, the diffusion depth of the anode short circuits can be preferably chosen to be greater in the drive thyristor than in the main thyristor.

Figure 1:
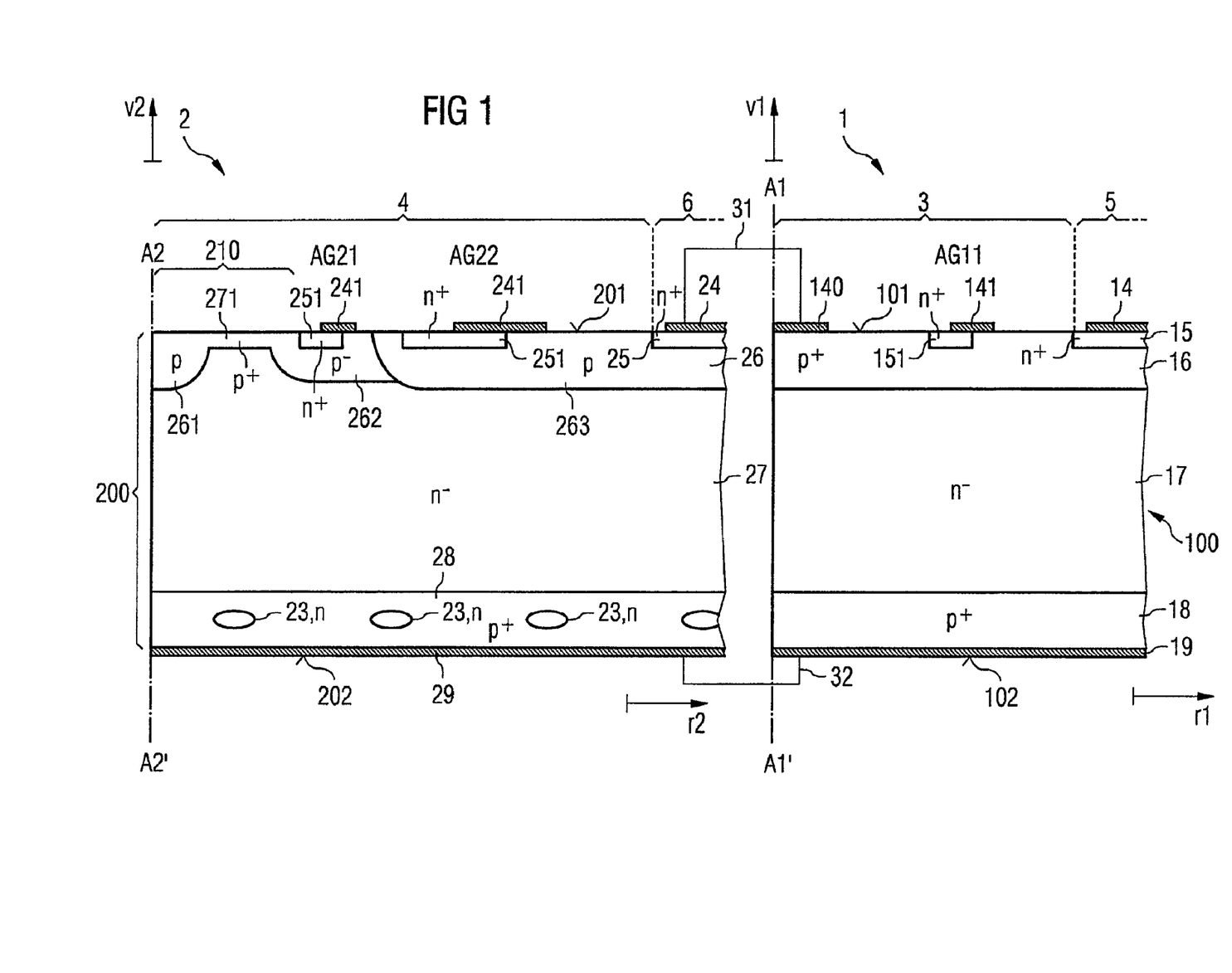
FIG. 1 shows a cross section through a symmetrically blocking thyristor system according to an embodiment.

FIG. 1 shows a cross section through a thyristor system having a main thyristor 1 and a drive thyristor 2. The main thyristor 1 has a semiconductor body 100, in which a p-doped emitter 18, an n-doped base 17, a p-doped base 16 and an n-doped emitter 15 are arranged successively proceeding from a rear side 102. The semiconductor body 100 has a front side 101 opposite the rear side 102.

A metallic cathode electrode 14 applied to the front side 101 and an anode electrode 19 applied to the rear side 102 are provided for the purpose of making electrical contact. The cathode electrode 14 makes contact with the heavily n-doped emitter 15 and the anode electrode 19 makes contact with the heavily p-doped emitter 18.

For triggering the main thyristor 1, the semiconductor body 100 thereof has a control electrode 140 arranged on the front side 101, said control electrode also being referred to as a gate terminal.

Furthermore, the main thyristor 1 comprises a triggering stage structure arranged between the control electrode 140 and the heavily n-doped emitter 15 in the lateral direction r1 of the semiconductor body 100. The triggering stage structure comprises as illustrated one, or as an alternative a plurality of triggering stages AG11 spaced apart from one another in the lateral direction r1. Each triggering stage AG11 preferably comprises a heavily n-doped triggering stage emitter 151, which extends into the semiconductor body proceeding from the front side 101 and with which contact is made by an electrode 141 arranged on the front side 101.

The semiconductor body 100 is preferably embodied rotationally symmetrically about an axis A1-A1' of symmetry running in the vertical direction v1. In this case, the cathode electrode 14, the one or a plurality of triggering stage electrodes 141, the control terminal 140, the triggering stage emitter or emitters 151, the main emitter 15 and the anode electrode 19 are preferably also embodied rotationally symmetrically and thus in circular disk form.

The main thyristor 1 may have other symmetries instead of a rotational symmetry. In accordance with a further embodiment, the axis A1-A1' is a fourfold axis of symmetry of the semiconductor body of the main thyristor 1, that is to say that after a rotation of the semiconductor body through 90°, 180° or 270°, the latter is projected onto itself. In this case, the semiconductor body 100 and/or the anode electrode 19 and, if appropriate, the control electrode 140 have a square cross section in a plane perpendicular to the vertical direction v1. The cathode electrode 14 and the triggering stage electrodes 141 preferably have square-ring-shaped cross sections in the case of a fourfold axis A1-A1' of symmetry.

The main thyristor 1 comprises a triggering stage region 3 extending as far as the n-doped emitter 15 in the lateral direction r1 proceeding from the axis A1-A1' of symmetry. The triggering stage region 3 comprises, in particular, the control electrode 140 and all the triggering stages AG11.

A main cathode region 5 comprising the n-doped emitter 15 and the main cathode electrode 14 is adjacent to the triggering stage region 3 in the lateral direction r1.

The drive thyristor 2 has a basic construction that may have the same features as the previously explained basic construction of the main thyristor 1.

Specifically, the drive thyristor 2 comprises a semiconductor body 200, in which a p-doped emitter 28, an n-doped base 27, a p-doped base 26 and an n-doped emitter 25 are arranged successively proceeding from a rear side 202. The p-doped base 26 comprises portions 261, 262 and 263.

The drive thyristor 2 is also preferably embodied rotationally symmetrically. The axis of symmetry is designated by A2-A2' in FIG. 1. As an alternative, the drive thyristor 2 may also have a different symmetry, preferably a fourfold rotational symmetry about the axis A2-A2'.

The drive thyristor 2 has a triggering stage region 4 in the lateral direction r2 of its semiconductor body 200, said triggering stage region extending as far as the n-doped emitter 25 proceeding from the axis A2-A2' of symmetry. A main cathode region 6 comprising the n-doped emitter 25 and a cathode electrode 24, which makes contact with the latter, is adjacent to the triggering stage region 4 in the lateral direction r2.

In the triggering stage region 4, the drive thyristor 2 has a breakdown structure 210 formed by virtue of the fact that between the portions 261, 262 of the p-doped base 26, a portion 271 of the n-doped base 27 extends further in the direction of the front side 201 of the semiconductor body 200 than in the rest of the regions.

On account of a curvature of the pn junction between the p-doped base 26 and the n-doped base 27, the drive thyristor 2 has a reduced breakdown voltage in the region of the breakdown structure 210 compared with the other regions of the thyristor so that the location of the first voltage breakdown is fixed at the region of the breakdown structure 210. By means of a suitable embodiment of the breakdown structure 210, in particular a curvature of the pn junction between the p-doped base 26 and the weakly n-doped base 27, but also by means of the dopant concentrations thereof in the region of the breakdown structure 210, the breakdown voltage of the drive thyristor 2, that is to say the voltage at which the breakover triggering of the drive thyristor 2 occurs, can be established in a defined manner.

By way of example, two triggering stages AG21, AG22 are arranged between the breakdown structure 210 and the n-doped emitter 25 in the lateral direction r2. However, the number of triggering stages AG21, AG22 is arbitrary in principle, that is to say that the drive thyristor 2 may have one, two, three or more triggering stages AG21, AG22.

Each of the triggering stages AG21, AG22 comprises a heavily n-doped triggering stage emitter 251 and also a triggering stage electrode 241, which is arranged on the front side 201 of the semiconductor body 200 and makes contact with the relevant triggering stage emitter 251. In the case of the drive thyristor 2, too, all the triggering stages AG21, AG22 present are arranged in the triggering stage region 4.

The drive thyristor 2 is preferably triggered by electromagnetic radiation, in particular infrared or visible light, which is radiated onto the front side 201 in the region of the breakdown structure 210.

Optionally, or as an alternative to this, the drive thyristor 2 may also have a control electrode (not illustrated) which may be embodied according to the control electrode 140 of the main thyristor 1 or according to the triggering stage electrode 241 of the triggering stage AG21 situated at the furthest distance from the n-doped emitter 25.

For electrically interconnecting the main thyristor 1 and the drive thyristor 2, the control terminal 140 of the main thyristor 1 and the n-doped emitter 25 of the drive thyristor 2 are electrically connected to one another by means of a connecting line 31 between the cathode electrode 24 of the drive thyristor 2 and the control terminal 140 of the main thyristor 1. Furthermore, the p-doped emitters 18, 28 of the main thyristor 1 and of the drive thyristor 2, respectively, are electrically connected to one another by means of a further connecting line 32 between the anode electrodes 18, 28 of the drive thyristor 2 and of the main thyristor 1.

This interconnection makes it possible to trigger the main thyristor 1 by triggering of the drive thyristor 2. In this case, the drive thyristor 2 supplies the triggering current for the main thyristor 1.

In order to avoid the situation where the main thyristor 1 may be triggered in its recovery time and thus be destroyed, the drive thyristor 2 has one or a plurality of recovery protection measures.

A first measure which may be applied both to a symmetrically blocking thyristor system in accordance with FIG. 1 and to an asymmetrically blocking thyristor system (see FIG. 2), consists in choosing the charge carrier lifetime in the n-doped base 27 of the drive thyristor 2 to be greater than the charge carrier lifetime in the n-doped base 17 of the main thyristor 1.

Figure 2:
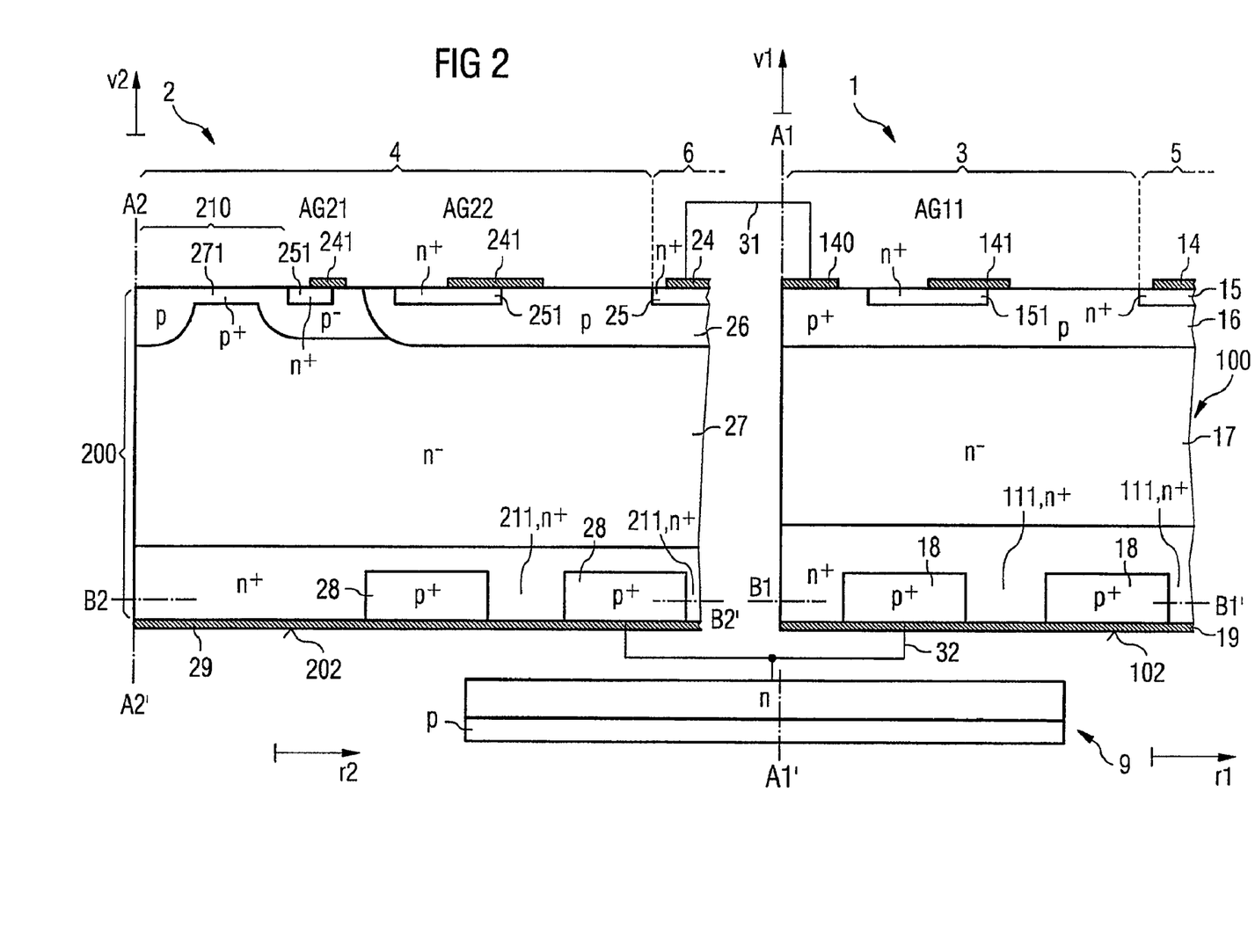
FIG. 2 shows a cross section through an asymmetrically blocking thyristor system according to an embodiment, a diode being connected in series with said system.

Preferably, the charge carrier lifetime of the n-doped base 27 of the drive thyristor 2 in the triggering stage region 4 and/or in the main cathode region 6 is greater than or equal to 300 μs. These measures have the effect that in the case of a surge voltage occurring, the drive thyristor 2 turns on again more rapidly than the main thyristor 1 and reliably triggers the latter again.

In this case, the charge carrier lifetime in the main cathode region 6 of the drive thyristor 2 may be set by means of an electron irradiation on the front side, in the case of which the triggering stage region 4 is covered by a suitable mask. By means of the electron irradiation, the charge carrier lifetime in the main cathode region is reduced as the irradiation dose increases.

A reduction of the charge carrier lifetime is preferably performed when homogenization of the charge carrier lifetime distribution is necessary on account of process-dictated impurities or on account of impurities in the starting material of the semiconductor body. In the case of no, or in the case of only tiny, impurities, it is possible to dispense with reducing the charge carrier lifetime.

A further measure for realizing a recovery protection in the case of a symmetrically blocking thyristor system consists in incorporating n-doped islands 23 into the p-doped emitter 28 of the drive thyristor 2.

Said n-doped islands 23 produce local npn-doped transistors which, in the case of a reverse voltage present across the drive thyristor 2, inject additional charge carriers and improve the recovery protection. In this case, the n-doped islands of the drive thyristor 2 may be more heavily doped than corresponding n-doped islands of a (main) thyristor which is not driven by a drive thyristor.

FIG. 2 shows an arrangement of an asymmetrically blocking thyristor system which comprises a main thyristor 1 and a drive thyristor 2 and the basic construction and electrical interconnection of which correspond to the basic construction and electrical interconnection of the thyristor system in accordance with FIG. 1, and which are interconnected in the same way. In order to extend this thyristor system to form a symmetrically blocking overall system, it is possible, in accordance with FIG. 2, for a diode 9 to be connected in series with the thyristor system 1, 2.

Within the meaning of the present application, the expression "thyristor system" relates only to a main thyristor and a drive thyristor which are electrically interconnected with one another in the manner described. A diode 9 used for producing a symmetrically blocking overall system is not assigned to the thyristor system in this case.

Figure 3A:
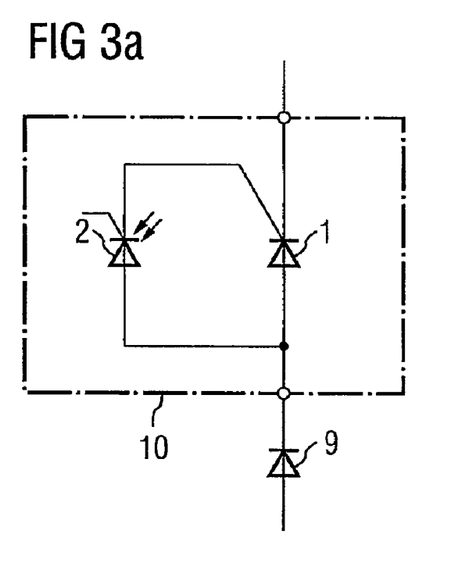
FIG. 3a shows a circuit diagram of a thyristor system in accordance with FIG. 2, a diode being connected in series with said system.

FIG. 3a shows a circuit diagram with a thyristor system 10 in accordance with FIGS. 1 and 2. The thyristor system 10 has a main thyristor 1 and also a light-triggerable drive thyristor 2. The cathode of the drive thyristor 2 is electrically connected to the control terminal of the main thyristor 1. Furthermore, the anodes of the main thyristor 1 and of the drive thyristor 2 are electrically connected to one another.

In the case of an asymmetrically blocking thyristor system 10, an optional diode 9 may be connected in series with the latter in order to obtain a symmetrically blocking overall system comprising thyristor system 10 and diode 9.

Figure 3B:
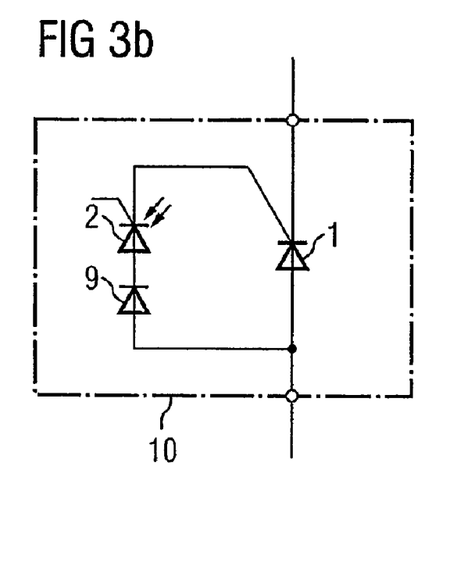
FIG. 3b shows a circuit diagram of a thyristor system having a symmetrically blocking main thyristor, between the anode and gate terminal of which is connected a symmetrically blocking drive system formed by connection in series of an asymmetrically blocking drive thyristor and a diode.

An alternative arrangement for a symmetrically blocking thyristor system is shown in FIG. 3b. The thyristor system comprises a symmetrically blocking main thyristor 1, which is driven by a symmetrically blocking drive system comprising an asymmetrically blocking drive thyristor 2 and a diode 9 connected in series with the latter.

In the case of this arrangement, the anode of the diode 9 is connected to the anode of the main thyristor 1, the cathode of the diode 9 is connected to the anode of the drive thyristor 2 and the cathode of the drive thyristor 2 is connected to the gate terminal of the main thyristor 1.

As an alternative to this, in the series circuit of the drive system, the order of the drive thyristor 2 and the diode 9 may also be interchanged, so that the anode of the drive thyristor 2 is connected to the anode of the main thyristor 1, the cathode of the drive thyristor 2 is connected to the anode of the diode 9 and the cathode of the diode 9 is connected to the gate terminal of the main thyristor 1.

In the drive thyristor 2, the p-doped base 26, the weakly n-doped base 27 and the heavily n-doped anode short circuits form a $pn^-n^+$ diode which is forward-biased upon application of a reverse voltage to the drive thyristor and thus injects charge carriers into the triggering stage region 4. Since a reverse voltage is usually present across the thyristor system during the recovery phase, the recovery protection can be intensified by intensifying the charge carrier injection by means of said $pn^-n^+$ diode. For this purpose, the local $pn^-n^+$ diode is preferably designed such that a largest possible portion of the reverse current of the diode 9 connected in series with the thyristor system, which diode takes up the majority of the reverse voltage occurring across the entire thyristor system, flows through said local $pn^-n^+$ diode of the drive thyristor 2.

In the case of the asymmetrically blocking thyristor system in accordance with FIG. 2, both the p-doped emitter 18 of the main thyristor 1 and the p-doped emitter 28 of the drive thyristor 2 have heavily n-doped regions 111 and 211, respectively, which extend into the relevant semiconductor body 100 and 200, respectively, proceeding from the rear sides 102 and 202, respectively, to a depth that is greater than or equal to the thickness of the respective p-doped emitters 18 and 28. These n-doped regions 111, 211 are also referred to below as "anode short circuits".

Figure 4:
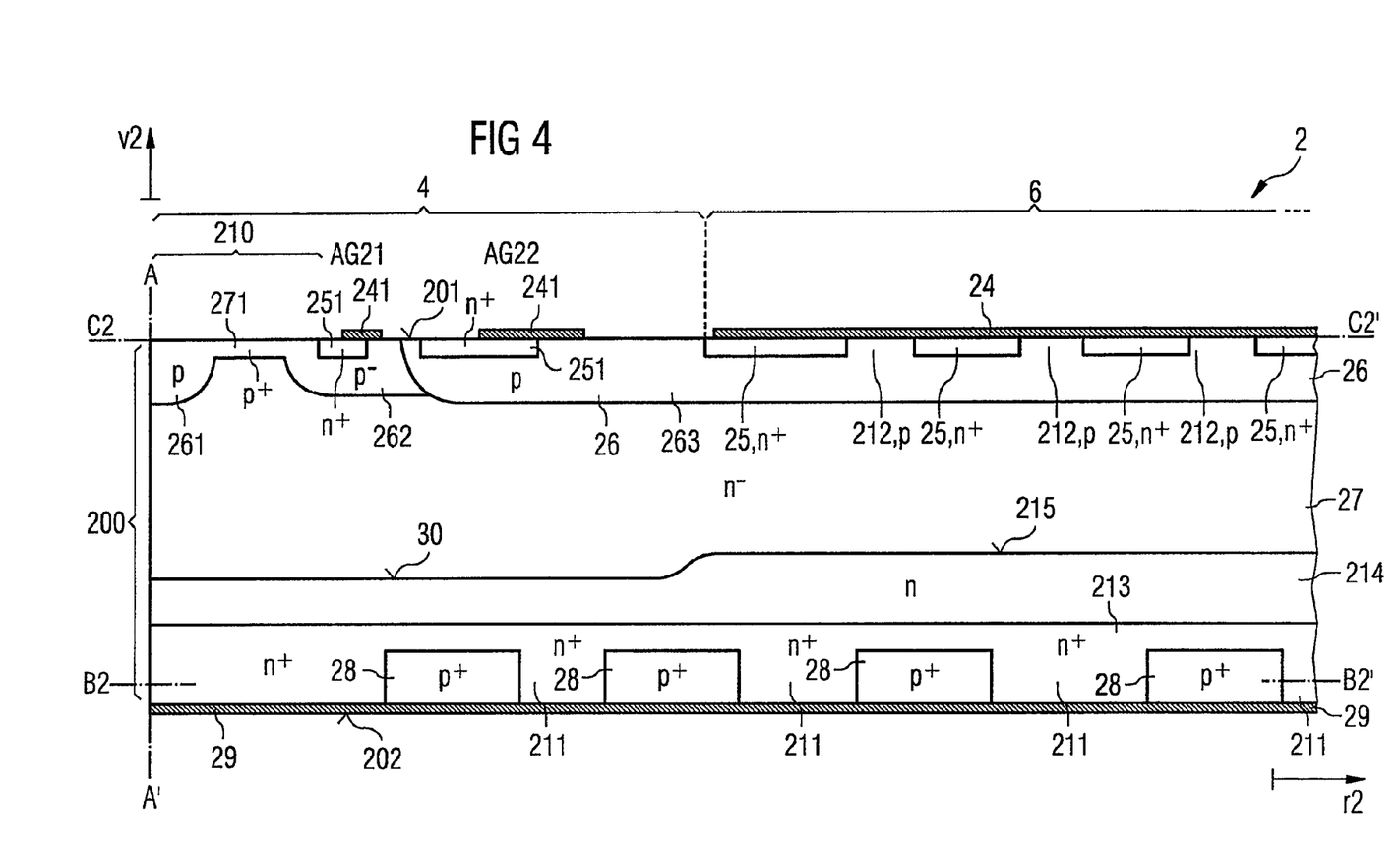
FIG. 4 shows a cross section through a drive thyristor of a thyristor system according to an embodiment having anode short circuits and cathode short circuits and also having a field stopping zone arranged between the weakly n-doped base and the heavily p-doped emitter.

In corresponding manner, as shown in FIG. 4, p-doped regions 212 may also be provided in the region of the heavily n-doped emitter 25, which p-doped regions extend into the semiconductor body 2 of the drive thyristor 2 proceeding from the front side 201, to a depth that is greater than or equal to the thickness of the heavily n-doped emitter 25. These p-doped regions 212 are also referred to below as "cathode short circuits".

Furthermore, the drive thyristor 2 in accordance with FIG. 4 has an n-doped field stopping zone 214 arranged between the weakly n-doped base 27 and the heavily p-doped emitter 28. The field stopping zone 214 may either directly adjoin the heavily p-doped emitter 28 or be spaced apart from the latter. In order to realize or intensify an integrated recovery protection function, the field stopping zone 214 within the triggering stage region 4 of the drive thyristor 2 may have a lower doping concentration or a lower doping dose or a lower penetration depth than the field stopping zone 214 in the main cathode region 6 of the drive thyristor 2.

The main thyristor 1 may also have such anode and/or cathode short circuits and a field stopping zone.

Figure 5:
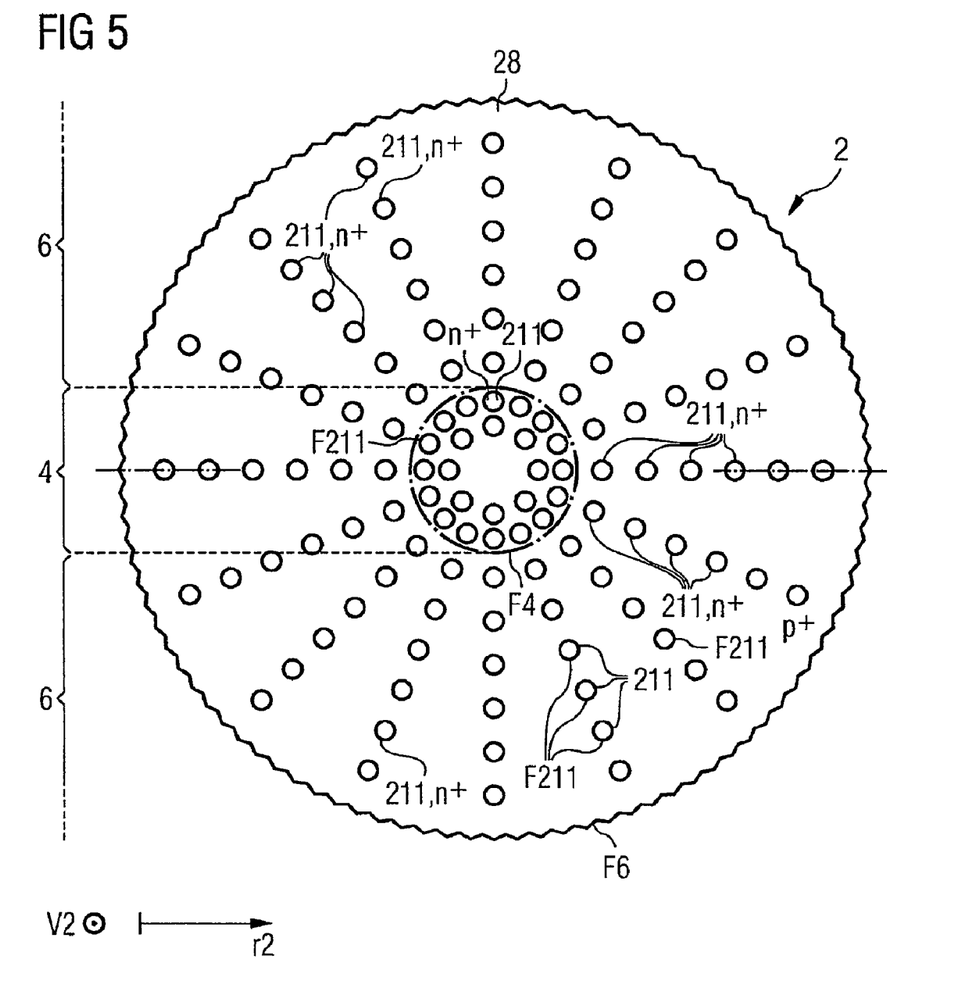
FIG. 5 shows a horizontal section through the semiconductor body of the drive thyristor in accordance with FIGS. 2 and 4 in the region of the p-doped emitter.

FIG. 5 shows a cross section in a sectional plane B2-B2', perpendicular to the vertical direction v2 through the n-doped anode short circuits 211 of the drive thyristor 2 in accordance with FIGS. 2 and 4. It can be discerned here that the strong anode short circuits 211 in accordance with one preferred embodiment have a circular cross section. However, the shape of the cross section is arbitrary, in principle.

The anode short circuits 211 have cross sectional areas F211. The total area of the triggering stage region 4 including the cross sectional areas F211 contained therein is designated by F4 below. The area of the main cathode region 6 including the areas F211 of the anode short circuits 211 arranged in the main cathode region 6 is correspondingly designated by F6.

The term "cross sectional area ratio" used below specifies the ratio between the area proportions of the cross sectional areas F211 of the anode short circuits 211 that lie in a specific region and the total area of said region.

In the present exemplary embodiment, the cross sectional area ratio of the anode short circuits 211 in the triggering stage region 4 is equal to 24×F211:F4. In this case, the areas of the individual short circuits F211 in FIGS. 4 and 6 need not necessarily correspond.

As a further measure for producing a recovery protection, it is provided that the anode short circuits 211 of the drive thyristor 2 in the triggering stage region 4 have a cross sectional area ratio that is less than the cross sectional area ratio in the main cathode region 6 of the drive thyristor 2.

Figure 6:
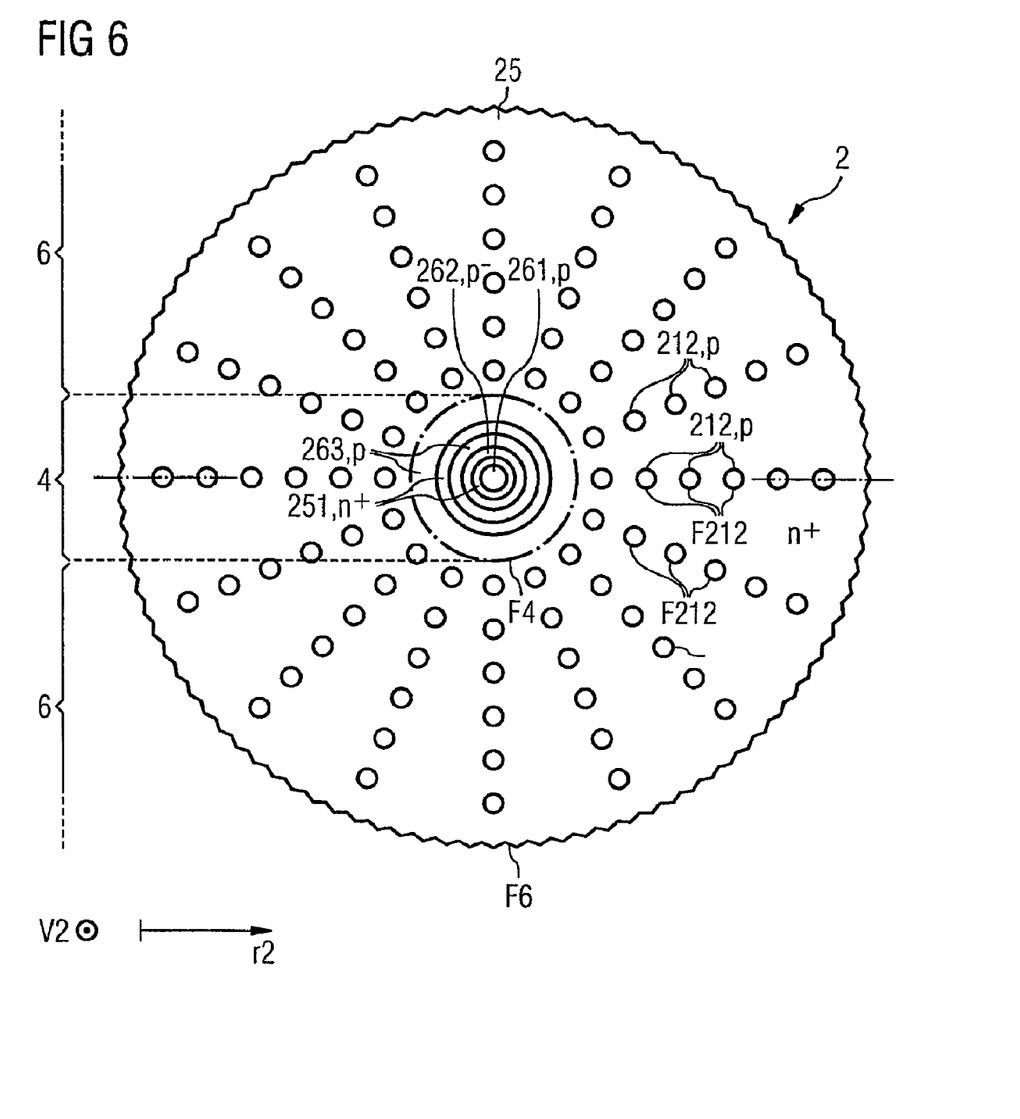
FIG. 6 shows a cross section through a semiconductor body of the drive thyristor in accordance with FIGS. 2 and 4 in the region of the n-doped emitter.

FIG. 6 shows a cross section through the plane C2-C2' illustrated in FIG. 4, said plane being perpendicular to the vertical direction v2 and running through the n-doped emitter 25 and also the p-doped cathode short circuits 212.

It can be discerned in this view that the cathode short circuits 212 are only arranged in the main cathode region 6. The cathode short circuits 212 have cross sectional areas F212. The cross sectional area ratio of the cathode short circuits 212 arranged in the cathode region 6 is calculated according to the cross sectional area ratio of the anode short circuits 211.

In the present exemplary embodiment, the cross sectional area ratio of the anode short circuits 211 is equal to the ratio between the total area of the cathode short circuits 212 arranged in the main cathode region 6 and the area F6.

For a predetermined region, a cross sectional area ratio of the anode short circuits and/or of the cathode short circuits may also be determined for the main thyristor in a corresponding manner.

As a measure for producing a recovery protection, it is provided that the cross sectional area ratio of the anode short circuits 211 of the drive thyristor 212 in the triggering stage region is less than the cross sectional area ratio of the anode short circuits 211 of the drive thyristor 2 in the main cathode region 6.

Another measure for realizing a recovery protection consists, in the case of an asymmetrically blocking thyristor system in which the main thyristor 1 and the drive thyristor 2 respectively have anode short circuits 111 and 211, in choosing the cross sectional area ratio of the anode short circuits 211 in the main cathode region 4 of the drive thyristor 2 to be less than the cross sectional area ratio of the anode short circuits 111 in the main cathode region 5 of the main thyristor 1.

A further measure for realizing a recovery protection consists in increasing the depth of the anode short circuits 211 in the vertical direction v2 in the drive thyristor 2, preferably locally in the triggering stage region 4. What is suitable for this purpose is a preferably masked implantation of protons followed by an annealing process in which the semiconductor body 200 is heated to a temperature of 220° C. to 500° C. for a time of 30 minutes to 10 hours. During the irradiation, the acceleration energy of the protons is chosen such that their penetration depth amounts to at least the depth of the anode short circuits 211.

A further possibility for producing such anode short circuits 211 consists in introducing a rapidly diffusing donor, for example sulfur or selenium, into the semiconductor body 200 on the rear side by means of a preferably masked diffusion process proceeding from the rear side 202.

In accordance with a further preferred embodiment, the anode short circuits 211 of the drive thyristor 2 are indiffused, for example by means of a phosphorus doping, into the semiconductor body 200 more deeply than the anode short circuits 111 are indiffused into the semiconductor body 100 of the main thyristor 1.

Referring to the asymmetrically blocking thyristor system in accordance with FIGS. 2 and 4, a recovery protection may also be realized or improved by locally increasing the dopant concentration of the p-doped base 26 of the drive thyristor 2 in the triggering stage region 4.

Figure 7:
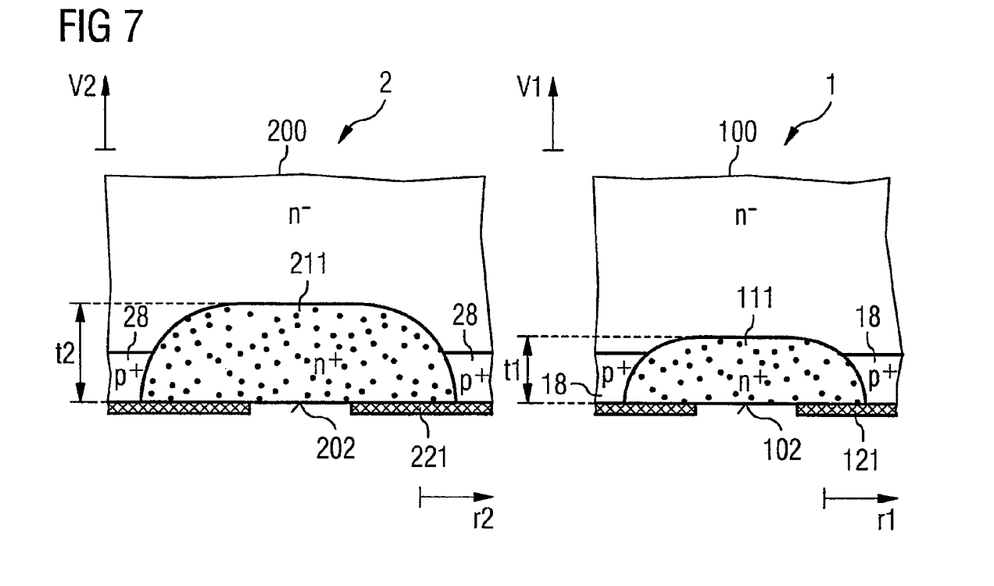
FIG. 7 shows a cross section through portions of a drive thyristor and of a main thyristor which in each case have anode short circuits, the anode short circuits of the drive thyristor projecting into the semiconductor body of the drive thyristor more deeply than the anode short circuits of the main thyristor project into the semiconductor body of the main thyristor.

FIG. 7 shows a respective detail from a main thyristor 1 and from a drive thyristor 2 of a thyristor system. The details respectively show an anode short circuit 111, 211, the anode short circuit 211 of the drive thyristor 2 having a diffusion depth t2 that is greater than the diffusion depth t1 of the anode short circuit 111 of the main thyristor 1.

Phosphorus is preferably used as a dopant for producing the anode short circuits 111, 211. The indiffusion of the dopants for producing the anode short circuits 111, 211 is preferably effected using patterned mask layers 121 and 221, respectively, which are applied to the relevant rear sides 102 and 202 of the respective semiconductor bodies 100 and 200 of the main thyristor 1 and of the drive thyristor 2 respectively. The diffusion depths t1 and t2 are primarily set by means of suitably chosen diffusion times and diffusion temperatures.

Since, in a thyristor system according to an embodiment, the forward blocking capability of the main thyristor is preferably chosen to be greater than the forward blocking capability of the drive thyristor, it is advantageous to choose the n-doped base 27 of the drive thyristor 2 to be thicker in the vertical direction v2 than the n-doped base 17 of the main thyristor 1 in the vertical direction v1 thereof. This makes it possible to obtain, despite the unavoidable technologically dictated variations of the forward blocking capabilities in the production of a multiplicity of main thyristors and drive thyristors, with a relatively small difference between the breakdown voltage of the drive thyristors and the edge blocking capability of the main thyristors, mutually matched pairs each comprising a main thyristor and a drive thyristor and thus to increase the yield. This measure primarily enables the edge blocking capability of the drive thyristor to be noticeably increased, with the result that the breakdown voltage of the breakdown structure 210 reliably lies below the edge breakdown voltage of the drive thyristor.

It is advantageous for measures for overvoltage protection and also a so-called dU/dt protection function, as mentioned for example in the article "Thyristor with Integrated Forward Recovery Protection" mentioned in the introduction, additionally to be integrated into the drive thyristor alongside the abovementioned possibility for light triggering and the integrated recovery protection.

Figure 8:
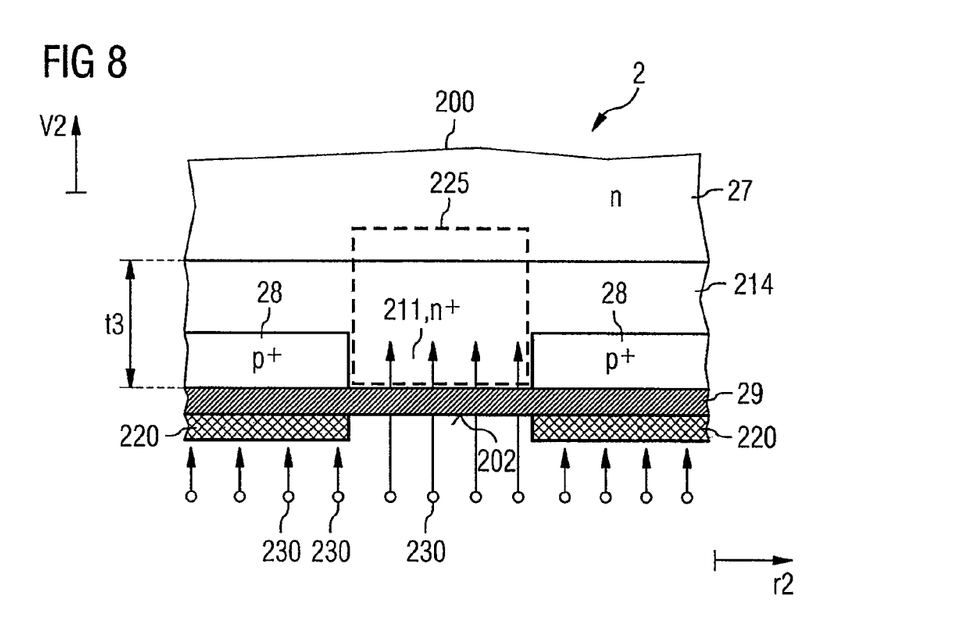
FIG. 8 shows a method for increasing the depth of anode short circuits of a drive thyristor.

FIG. 8 shows a further measure for producing or setting a recovery protection of a thyristor system. For this purpose, a patterned mask layer 220 is applied to the rear side 202 of the drive thyristor 2 and particles 230 are implanted into the semiconductor body 200 through the opening in said mask layer. The particles 230 are implanted into a target region 225, which preferably extends into the semiconductor body 200 proceeding from the rear side 202 of the semiconductor body 200.

Protons by way of example may be used as particles 230 to be implanted. After the implantation, the semiconductor body is heated to a temperature of 220° C. to 500° C. for a duration of between 30 minutes and 10 hours. The acceleration energy of the particles 230 to be implanted is preferably chosen such that they penetrate into the semiconductor body 200 at least as far as the depth t3 of the anode short circuits 211.

The implantation of the particles 230 may—as is illustrated in FIG. 8—be effected through the anode electrode 29. As an alternative (not illustrated) the implantation may, of course, also be effected prior to the production of the anode electrode 29.

List of Reference Symbols

1 Main thyristor
2 Drive thyristor
3 Triggering stage region of the main thyristor
4 Triggering stage region of the drive thyristor
5 Main cathode region of the main thyristor
6 Main cathode region of the drive thyristor
9 Diode
10 Thyristor system
14 Cathode electrode (main thyristor)
15 n-doped emitter of the main thyristor (cathode)
16 p-type base of the main thyristor
17 n-type base of the main thyristor
18 p-type emitter of the main thyristor (anode)
19 Cathode electrode (main thyristor)
23 n-doped island (drive thyristor)
24 Cathode electrode (drive thyristor)
25 n-type emitter of the drive thyristor (cathode)
26 p-type base of the drive thyristor
27 n-type base of the drive thyristor
28 p-type emitter of the drive thyristor (anode)
29 Anode electrode (drive thyristor)
31, 32 Connecting line
100 Semiconductor body (main thyristor)
101 Front side of the semiconductor body (main thyristor)
102 Rear side of the semiconductor body (main thyristor)
111 Anode short circuit (main thyristor)
112 Cathode short circuit (main thyristor)
121 Mask layer
140 Control electrode (main thyristor)
141 Electrode of the triggering stage emitter (main thyristor)
151 Triggering stage emitter (main thyristor)
200 Semiconductor body (drive thyristor)
201 Front side of the semiconductor body (drive thyristor)
202 Rear side of the semiconductor body (drive thyristor)
210 Breakdown structure (drive thyristor)
211 Anode short circuit (drive thyristor)
212 Cathode short circuit (drive thyristor)
214 Field stopping zone (drive thyristor)
220 Mask layer
221 Mask layer
225 Target region
230 Particles which—if appropriate after a heat treatment step—induce an n-type doping, e.g. protons
241 Electrode of the triggering stage emitter (drive thyristor)
251 Triggering stage emitter (drive thyristor)
261 First portion of the p-type base (drive thyristor)
262 Second portion of the p-type base (drive thyristor)
263 Third portion of the p-type base (drive thyristor)
271 Portion of the n-type base
A1-A1' Axis (main thyristor)
A2-A2' Axis (drive thyristor)
B2-B2' Horizontal axis through p-type emitter (drive thyristor)
C2-C2' Horizontal axis through n-type emitter (drive thyristor)
AG11 First triggering stage (main thyristor)
AG21 First triggering stage (drive thyristor)
AG22 Second triggering stage (drive thyristor)
F211 Cross sectional area of the anode short circuits
F4 Area of the triggering stage region (drive thyristor)
F6 Area of the main cathode region (drive thyristor)
r1 Lateral direction (main thyristor)
r2 Lateral direction (drive thyristor)
t1 Diffusion depth of anode short circuit (main thyristor)
t2 Diffusion depth of anode short circuit (drive thyristor)
t3 Depth of the anode short circuit (drive thyristor)
v1 Vertical direction (main thyristor)
v2 Vertical direction (drive thyristor)

What is claimed is:

1. A thyristor system comprising:
a main thyristor having a semiconductor body in which a p-doped emitter, an n-doped base, a p-doped base and an n-doped emitter are arranged successively proceeding from a rear side, and which has a triggering stage region having at least one triggering stage and a main cathode region adjacent to the triggering stage region in the lateral direction,
a drive thyristor having a semiconductor body, in which a p-doped emitter, an n-doped base, a p-doped base and an n-doped emitter are arranged successively proceeding from a rear side and which has a triggering stage region having at least one triggering stage and a main cathode region adjacent to the triggering stage region in the lateral direction,
the semiconductor body of the drive thyristor being distinct from the semiconductor body of the main thyristor,
the n-doped emitter of the drive thyristor being electrically connected to a control terminal of the main thyristor,
the p-doped emitter of the drive thyristor being electrically connected to the p-doped emitter of the main thyristor, and
the drive thyristor having a measure for recovery protection and/or a breakdown structure.

2. A thyristor system according to claim 1, wherein the measure for recovery protection comprises the feature that a charge carrier lifetime of the n-doped base of the drive thyristor is chosen to be greater than or equal to a charge carrier lifetime of the n-doped base of the main thyristor.

3. A thyristor system according to claim 1, wherein a charge carrier lifetime of the n-doped base of the drive thyristor in the triggering stage region and/or in the main cathode region is greater than or equal to 300 µs.

4. A thyristor system according to claim 1, wherein a charge carrier lifetime of the n-doped base of the drive thyristor in the triggering stage region is chosen to be greater than or equal to a charge carrier lifetime of the n-doped base of the drive thyristor in the main cathode region.

5. A thyristor system according to claim 4, wherein the charge carrier lifetime of the n-doped base of the drive thyristor in the triggering stage region amounts to at least 1.5 times the charge carrier lifetime of the n-doped base of the drive thyristor in the main cathode region.

6. A thyristor system according to claim 1, wherein the measure for recovery protection comprises the feature that the drive thyristor has n-doped islands which are incorporated into the p-doped emitter of the drive thyristor in the triggering stage region.

7. A thyristor system according to claim 6, wherein the n-doped islands of the drive thyristor are more heavily doped than n-doped islands arranged in the triggering stage region of the main thyristor.

8. A thyristor system according to claim 1, wherein the p-doped emitter in the triggering stage region of the drive thyristor has a dopant concentration greater than the dopant concentration of the p-doped emitter of the main thyristor in the main cathode region thereof.

9. A thyristor system according to claim 1, wherein the p-doped emitter in the triggering stage region of the drive thyristor has a dopant concentration greater than the dopant concentration of the p-doped emitter of the drive thyristor in the main cathode region thereof.

10. A thyristor system according to claim 1, wherein the drive thyristor has an n-doped field stopping zone, a doping concentration and/or doping dose and/or vertical extent of which is smaller in the triggering stage region than in the main cathode region.

11. A thyristor system according to claim 1, wherein the measure for recovery protection comprises the feature that the dopant concentration of the p-doped base of the drive thyristor is greater at selected locations in the triggering stage region than in the main cathode region.

12. A thyristor system according to claim 1, wherein the n-doped base of the drive thyristor has a greater thickness than the n-doped base of the main thyristor.

13. A thyristor system according to claim 1, wherein the drive thyristor has a breakdown structure having a predetermined breakdown voltage.

14. A thyristor system according to claim 13, wherein the main thyristor has a forward blocking capability that is greater than the breakdown voltage of the breakdown structure of the drive thyristor.

15. A thyristor system according to claim 1, wherein the drive thyristor is embodied in light-triggerable fashion.

16. A thyristor system according to claim 1, wherein the drive thyristor has p-doped cathode short circuits which connect the p-doped base to the cathode electrode of the n-doped emitter.

17. A thyristor system according to claim 1, wherein the drive thyristor has anode short circuits, the cross sectional area ratio of which is smaller in the triggering stage region than in the main cathode region.

18. A thyristor system according to claim 1, wherein the main thyristor and the drive thyristor in each case have anode short circuits, the anode short circuits in the main cathode region of the drive thyristor having a cross sectional area ratio that is smaller than the cross sectional area ratio of the anode short circuits in the main cathode region of the main thyristor.

19. A thyristor system according to claim 1, wherein both the main thyristor and the drive thyristor have anode short circuits and in which the anode short circuits of the drive thyristor proceeding from the rear side extend into the semiconductor body of the drive thyristor more deeply than the anode short circuits of the main thyristor proceeding from the rear side of the semiconductor body of the main thyristor.

20. A thyristor system according to claim 1, wherein a diode is connected in series with the load path of the main thyristor.

21. A thyristor system according to claim 1, wherein a load path of a diode and a load path of the drive thyristor are connected in series between an anode of the main thyristor and a gate terminal of the main thyristor.

22. A method for producing a thyristor system as claimed in claim 1, wherein the drive thyristor has anode short circuits, the method comprising the step of:
   introducing particles into a target region of the semiconductor body of the drive thyristor, the distance between the target region and a front side of the semiconductor body opposite to the rear side being less than or equal to the distance between the p-doped emitter and the front side.

* * * * *